(12) United States Patent
Sun

(10) Patent No.: US 9,532,494 B2
(45) Date of Patent: Dec. 27, 2016

(54) MANUFACTURING METHOD OF PACKAGE STRUCTURE

(71) Applicant: Shih-Hao Sun, Hsinchu County (TW)

(72) Inventor: Shih-Hao Sun, Hsinchu County (TW)

(73) Assignee: Subtron Technology Co., Ltd., Hsinchu County (TW)

( * ) Notice: Subject to any disclaimer, the term of this patent is extended or adjusted under 35 U.S.C. 154(b) by 148 days.

(21) Appl. No.: 14/324,232

(22) Filed: Jul. 6, 2014

(65) Prior Publication Data

US 2014/0317907 A1    Oct. 30, 2014

Related U.S. Application Data

(62) Division of application No. 13/288,972, filed on Nov. 4, 2011, now abandoned.

(30) Foreign Application Priority Data

May 20, 2011    (TW) .............................. 100117788 A

(51) Int. Cl.
*H05K 13/00*    (2006.01)
*H05K 1/02*    (2006.01)
(Continued)

(52) U.S. Cl.
CPC ................ *H05K 13/00* (2013.01); *H01L 23/13* (2013.01); *H01L 23/5389* (2013.01);
(Continued)

(58) Field of Classification Search
CPC ....... H05K 1/185–1/188; H05K 1/0203–1/021
See application file for complete search history.

(56) References Cited

U.S. PATENT DOCUMENTS 6,489,685 B2 * 12/2002 Asahi .................. H01L 23/5389
257/774
2006/0194103 A1    8/2006 Otohata et al.
(Continued)

FOREIGN PATENT DOCUMENTS

CN    101211027    7/2008
CN    101574024    11/2009
(Continued)

OTHER PUBLICATIONS

Machine Translation of JP 2010157663 A, obtained Jan. 26, 2016.*
(Continued)

*Primary Examiner* — Livius R Cazan
(74) *Attorney, Agent, or Firm* — Jianq Chyun IP Office

(57) ABSTRACT

A manufacturing method of a package structure is provided. A substrate having an upper surface and a lower surface opposite to each other and an opening communicating the surfaces is provided. An electronic device is configured in the opening. An adhesive layer and a patterned metal layer located on the adhesive layer are laminated on the lower surface and expose a bottom surface of the electronic device. A heat-dissipating column is formed on the bottom surface exposed by the adhesive layer and the patterned metal layer and connects the patterned metal layer and the bottom surface. A first and a second laminated structures are laminated on the upper surface of the substrate and the patterned metal layer, respectively. The first laminated structure covers the upper surface of the substrate and a top surface of the electronic device. The second laminated structure covers the heat-dissipating column and the patterned metal layer.

6 Claims, 4 Drawing Sheets

(51) Int. Cl.
  *H05K 1/18* (2006.01)
  *H01L 23/13* (2006.01)
  *H01L 23/538* (2006.01)
  *H01L 23/00* (2006.01)

(52) U.S. Cl.
  CPC .............. *H01L 24/19* (2013.01); *H01L 24/20* (2013.01); *H01L 2224/16225* (2013.01); *H01L 2224/16227* (2013.01); *H01L 2924/12041* (2013.01); *H01L 2924/15788* (2013.01); *H05K 1/0207* (2013.01); *H05K 1/185* (2013.01); *Y10T 29/49002* (2015.01); *Y10T 29/49126* (2015.01); *Y10T 29/49146* (2015.01)

(56) References Cited

U.S. PATENT DOCUMENTS

2007/0227761 A1* 10/2007 Tuominen ........... H01L 23/5389
                                                        174/252
2008/0230268 A1    9/2008 Kubo 2009/0071710 A1    3/2009 Stelzl et al.
2009/0072384 A1    3/2009 Wong et al.
2009/0138832 A1    5/2009 Bartley et al.
2010/0203679 A1    8/2010 Lin et al.

FOREIGN PATENT DOCUMENTS

| JP | 2003060523 | 2/2003 |
| JP | 2009295949 | 12/2009 |
| JP | 2010157663 | 7/2010 |
| JP | 2010157663 A * | 7/2010 |

OTHER PUBLICATIONS

"Office Action of China Counterpart Application", issued on May 29, 2014, p. 1-p. 6, in which the listed references were cited.

"Office Action of China Counterpart Application", issued on Jan. 29, 2015, p. 1-p. 6, in which the listed reference was cited.

* cited by examiner

MANUFACTURING METHOD OF PACKAGE STRUCTURE

CROSS-REFERENCE TO RELATED APPLICATION

This application is a divisional of U.S. application Ser. No. 13/288,972, filed on Nov. 4, 2011, now abandoned, which claims the priority benefit of Taiwan application serial no. 100117788, filed on May 20, 2011. The entirety of each of the above-mentioned patent applications is hereby incorporated by reference herein and made a part of specification.

BACKGROUND OF THE INVENTION

Field of the Invention

The invention relates to a package structure and a manufacturing method thereof. More particularly, the invention relates to a package structure with an embedded device and a manufacturing method of the package structure.

Description of Related Art

In recent years, electronic devices are frequently installed in a circuit board for improving electrical properties of the electronic devices, which is known as a system-in-package (SIP) structure. The SIP structure is referred to as a system integration package. Namely, the electronic devices are integrated into a single package in which passive devices, memories, electronic connectors, and other embedded devices are included. A variety of manufacturing methods can be applied to the SIP structure made of various materials. After the electronic devices are configured within the circuit board, conductive layers are stacked on the circuit board by applying a build-up method, so as to assemble the circuit board that has multiple layers.

Nevertheless, the SIP structure has a relatively complicated structure notwithstanding the fact that the SIP structure can effectively reduce package area and initially integrate the system. Moreover, in comparison with a single chip package, the SIP structure encounters more challenges with respect to its design for heat dissipation and maintenance of electrical reliability. Since the embedded devices are embedded in the multi-layer circuit board, the heat generated by the embedded devices is required to be dissipated out of the circuit board by means of a metal conductive layer and an insulating layer. That is to say, the package structure containing the conventional embedded devices can achieve limited heat-dissipating effects. Thereby, other devices in the package structure may not be normally functioned due to the excessive operational temperature, and the electrical performance or reliability of the package structure is further deteriorated.

SUMMARY OF THE INVENTION

The invention is directed to a package structure that has an embedded electronic device. The package structure can accomplish favorable heat-dissipating effects and have small package volume.

The invention is further directed to a manufacturing method of a package structure. By applying the manufacturing method, the aforesaid package structure can be formed.

In an embodiment of the invention, a manufacturing method of a package structure is provided. In the manufacturing method, a substrate is provided. The substrate has an upper surface, a lower surface, and an opening. The upper surface and the lower surface are opposite to each other, and the opening communicates the upper surface and the lower surface. An electronic device is configured in the opening. An adhesive layer and a patterned metal layer that is located on the adhesive layer are laminated on the lower surface of the substrate. Besides, the adhesive layer and the patterned metal layer expose a bottom surface of the electronic device. A heat-dissipating column is formed on the bottom surface of the electronic device exposed by the adhesive layer and the patterned metal layer. Here, the heat-dissipating column connects the patterned metal layer and the bottom surface of the electronic device. A first laminated structure and a second laminated structure are respectively laminated on the upper surface of the substrate and the patterned metal layer. The first laminated structure covers the upper surface of the substrate and a top surface of the electronic device, and the second laminated structure covers the heat-dissipating column and the patterned metal layer.

According to an embodiment of the invention, the electronic device includes a radio frequency (RF) device, an active device, or a passive device.

According to an embodiment of the invention, the first laminated structure includes at least one first dielectric layer, at least one first patterned metal layer, and at least one conductive via that penetrates the first dielectric layer. The first dielectric layer and the first patterned metal layer are sequentially stacked on the upper surface of the substrate. The opening is filled with the first dielectric layer. The first patterned metal layer is electrically connected to the electronic device through the conductive via.

According to an embodiment of the invention, the second laminated structure includes at least one second dielectric layer and at least one second patterned metal layer. The second dielectric layer and the second patterned metal layer are stacked on the patterned metal layer and the heat-dissipating column. The heat-dissipating column is in physical contact with the second patterned metal layer.

According to an embodiment of the invention, after the first laminated structure and the second laminated structure are laminated on the upper surface of the substrate and the patterned metal layer, the manufacturing method further includes forming a first solder mask layer on the first laminated structure and forming a second solder mask layer on the second laminated structure.

According to an embodiment of the invention, a method of laminating the first laminated structure and the second laminated structure on the upper surface of the substrate and the patterned metal layer includes thermal lamination.

According to an embodiment of the invention, a method of forming the heat-dissipating column on the bottom surface of the electronic device exposed by the adhesive layer and the patterned metal layer includes plating.

In an embodiment of the invention, a package structure that includes a substrate, an electronic device, an adhesive layer, a patterned metal layer, a heat-dissipating column, a first laminated structure, and a second laminated structure is provided. The substrate has an upper surface, a lower surface, and an opening. The upper surface and the lower surface are opposite to each other, and the opening communicates the upper surface and the lower surface. The electronic device is configured in the opening of the substrate and has a top surface and a bottom surface. The top surface and the bottom surface are opposite to each other. The adhesive layer is configured on the lower surface of the substrate and exposes the bottom surface of the electronic device. The patterned metal layer is adhered to the lower surface of the substrate through the adhesive layer and exposes the bottom surface of the electronic device. The heat-dissipating column is configured on the bottom surface of the electronic device exposed by the adhesive layer and the patterned metal layer. Here, the heat-dissipating column connects the patterned metal layer and the bottom surface of the electronic device. The first laminated structure is configured on the upper surface of the substrate and covers the upper surface of the substrate and the top surface of the electronic device. The second laminated structure is configured on the patterned metal layer and covers the heat-dissipating column and the patterned metal layer.

According to an embodiment of the invention, the electronic device includes an RF device, an active device, or a passive device.

According to an embodiment of the invention, the first laminated structure includes at least one first dielectric layer, at least one first patterned metal layer, and at least one conductive via that penetrates the first dielectric layer. The first dielectric layer and the first patterned metal layer are sequentially stacked on the upper surface of the substrate. The opening is filled with the first dielectric layer. The first patterned metal layer is electrically connected to the electronic device through the conductive via.

According to an embodiment of the invention, the second laminated structure includes at least one second dielectric layer and at least one second patterned metal layer. The second dielectric layer and the second patterned metal layer are stacked on the patterned metal layer and the heat-dissipating column. The heat-dissipating column is in physical contact with the second patterned metal layer.

According to an embodiment of the invention, the package structure further includes a first solder mask layer and a second solder mask layer. The first solder mask layer is configured on the first laminated structure. The second solder mask layer is configured on the second laminated structure.

Based on the above, the electronic device described in the embodiments of the invention is embedded in the substrate and the laminated structures, and the bottom surface of the electronic device is in physical contact with the heat-dissipating column. Hence, the heat generated by the electronic device in use can be dissipated by means of the underlying heat-dissipating column and the patterned metal layer, such that the package structure can accomplish favorable heat-dissipating effects. Moreover, since the electronic device is embedded in the substrate and the laminated structures, the package structure described in the embodiments of the invention can have small package volume and thin thickness.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the invention.

DESCRIPTION OF EMBODIMENTS

Figure 1A:
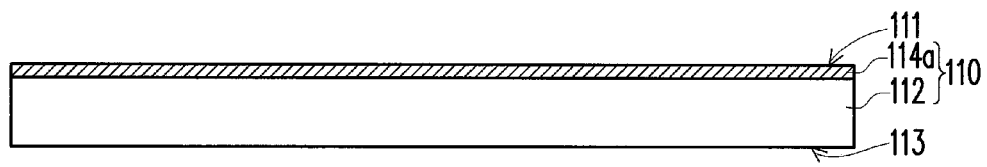
FIG. 1A to FIG. 1G are schematic cross-sectional views illustrating a manufacturing method of a package structure according to an embodiment of the invention.

FIG. 1A to FIG. 1G are schematic cross-sectional views illustrating a manufacturing method of a package structure according to an embodiment of the invention. As indicated in FIG. 1A, according to the manufacturing method of a package structure in this embodiment, a substrate 110 is provided. The substrate 110 has an upper surface 111 and a lower surface 113 opposite to the upper surface 111. The substrate 110 is constituted by an insulating layer 112 and a copper foil layer 114, for instance, and the insulating layer 112 is made of polyimide (PI) or epoxy resin, for instance. In other embodiments that are not shown in the drawings, the substrate can also be a double-sided board that is constituted by one insulating layer and two copper foil layers that are located at two respective sides of the insulating layer, or the substrate can be a glass fiber (FR4) substrate, which should not be construed as a limitation to the invention.

Figure 1B:
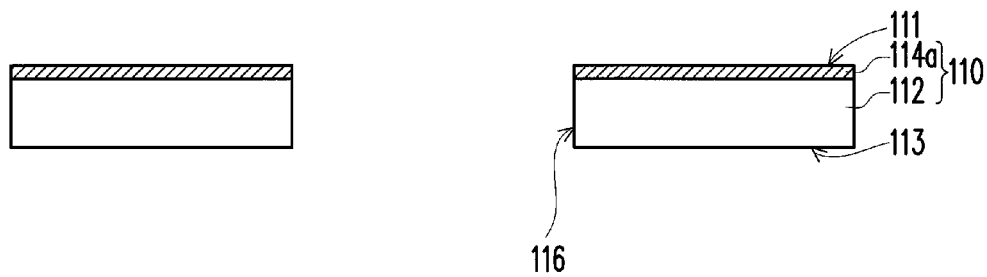

With reference to FIG. 1B, an opening 116 that communicates the upper surface 111 and the lower surface 113 of the substrate 110 is formed by stamping or routing, for instance.

Figure 1C:
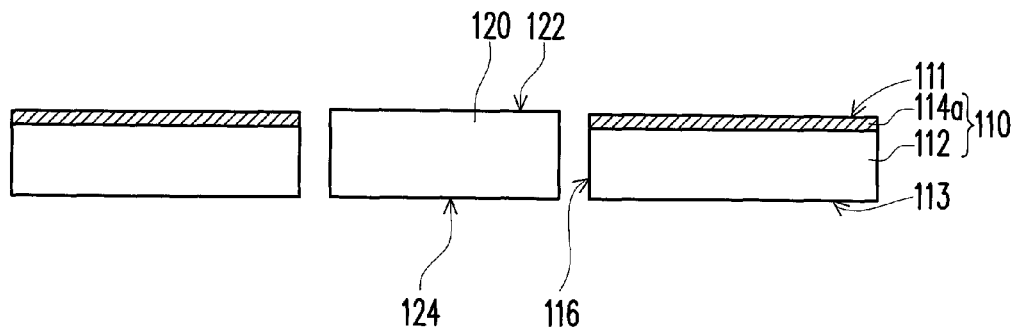

With reference to FIG. 1C, an electronic device 120 is configured in the opening 116 of the substrate 110. The diameter of the opening 116 of the substrate 110 is greater than the diameter of the electronic device 120. The electronic device 120 has a top surface 122 and a bottom surface 124 opposite to the top surface 122, and the electronic device 120 can be temporarily fixed into the opening 116 through an adhesive (not shown) that is configured on the upper surface 111 of the substrate 110. Here, the electronic device 120 is an RF device, an active device, a passive device, a memory, or an electronic connector, for instance.

Figure 1D:
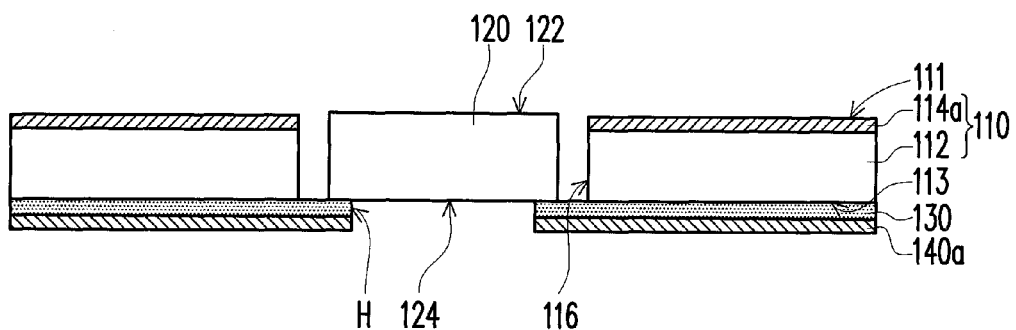

With reference to FIG. 1D, an adhesive layer 130 and a metal layer 140a that is located on the adhesive layer 130 are laminated on the lower surface 113 of the substrate 110. Here, the adhesive layer 130 and the metal layer 140a are laminated on the lower surface 113 of the substrate 110 by thermal lamination, for instance. At this time, the adhesive layer 130 and the metal layer 140a are conformally configured. A blind hole H that penetrates the adhesive layer 130 and the metal layer 140a is formed by mechanical drilling, such that the adhesive layer 130 and the metal layer 140a expose a portion of the bottom surface 124 of the electronic device 120. The adhesive (not shown) located on the upper surface 111 of the substrate 110 is removed to expose the copper foil layer 114a.

Figure 1E:
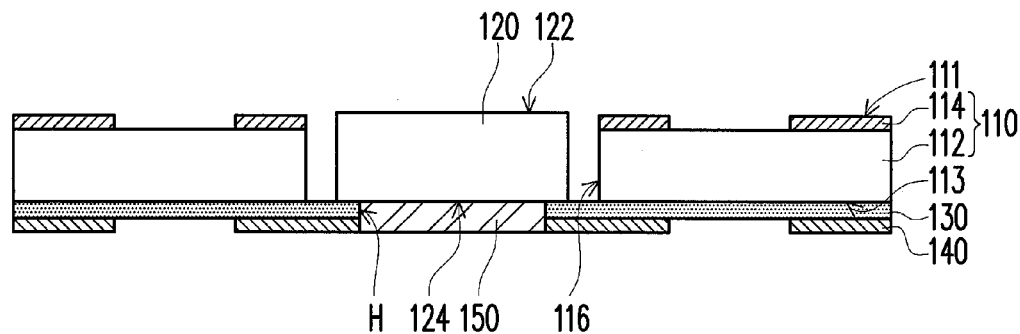

With reference to FIG. 1E, the copper foil layer 114a of the substrate 110 and the metal layer 140a are patterned to form a patterned copper foil layer 114 and a patterned metal layer 140. The patterned copper foil layer 114 exposes a portion of the surface of the insulating layer 112, and the patterned metal layer 140 exposes a portion of the adhesive layer 130.

As indicated in FIG. 1E, a heat-dissipating column 150 is formed in the blind hole H. Namely, the heat-dissipating column 150 is located on the portion of the bottom surface 124 of the electronic device 120 exposed by the adhesive layer 130 and the patterned metal layer 140. Here, the heat-dissipating column 150 is formed by plating, for instance, and the plating process can effectively enhance both the adhesion between the heat-dissipating column 150 and the patterned metal layer 140 and the adhesion between the heat-dissipating column 150 and the electronic device 120.

Figure 1F:
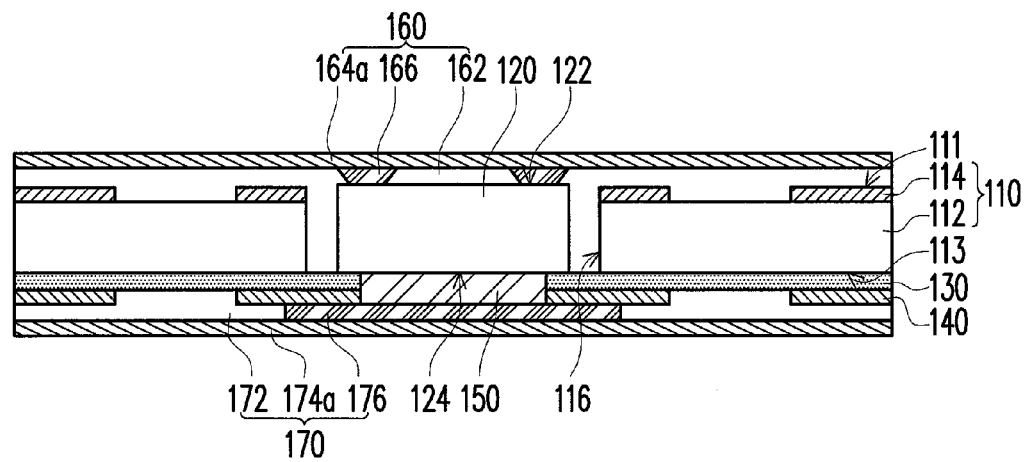

With reference to FIG. 1F, a first laminated structure 160 and a second laminated structure 170 are respectively laminated on the upper surface 111 of the substrate 110 and the patterned metal layer 140. The first laminated structure 160 covers the upper surface 111 of the substrate 110 and the top surface 122 of the electronic device 120, and the second laminated structure 170 covers the heat-dissipating column 150 and the patterned metal layer 140. The first laminated structure 160 and the second laminated structure 170 are respectively laminated on the upper surface 111 of the substrate 110 and the patterned metal layer 140 by thermal lamination, for instance.

To be more specific, the first laminated structure 160 described in this embodiment includes at least one first dielectric layer 162, at least one first metal layer 164a, and at least one conductive via 166 that penetrates the first dielectric layer 162. In FIG. 1F, one first dielectric layer 162, one first metal layer 164a, and two conductive vias 166 are schematically shown. The first dielectric layer 162 and the first metal layer 164a are sequentially stacked on the upper surface 111 of the substrate 110. The opening 116 is filled with the first dielectric layer 162 that is melted by heat, and thereby the electronic device 120 can be fixed into the opening 116. The first metal layer 164a can be electrically connected to the electrodes (not shown) located on the top surface 122 of the electronic device 120 through the conductive vias 166.

The second laminated structure 170 includes at least one second dielectric layer 172, at least one second metal layer 174a, and a second patterned metal layer 176. In FIG. 1F, one second dielectric layer 172 and one second metal layer 174a are schematically shown. The second dielectric layer 172, the second metal layer 174a, and the second patterned metal layer 176 are stacked on the patterned metal layer 140 and the heat-dissipating column 150. Here, the second dielectric layer 172 is located between the second metal layer 174a and the second patterned metal layer 176, and the heat-dissipating column 150 is in physical contact with the second patterned metal layer 176.

Figure 1G:
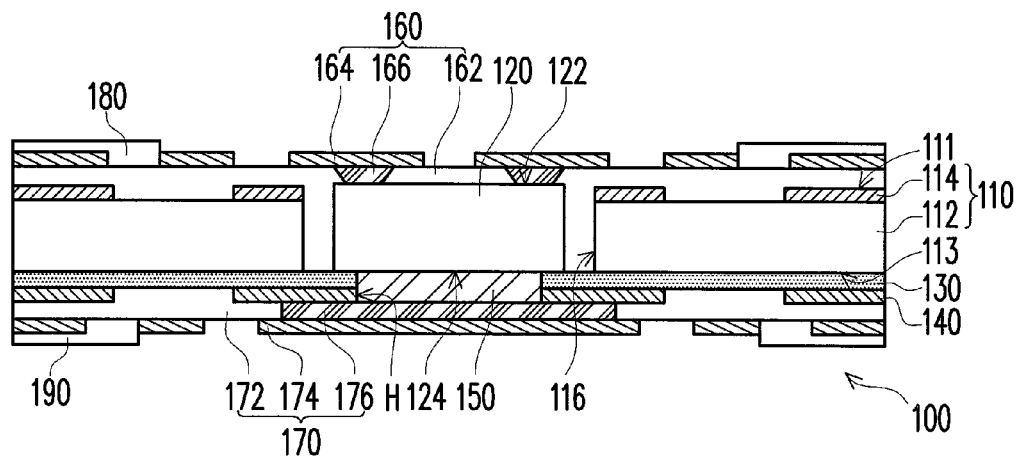

With reference to FIG. 1G, the first metal layer 164a of the first laminated structure 160 and the second metal layer 174a of the second laminated structure 170 are patterned to form a first patterned metal layer 164 and a second patterned metal layer 174. A first solder mask layer 180 is formed on the first laminated structure 160, and a second solder mask layer 190 is formed on the second laminated structure 170. Here, the first solder mask layer 180 exposes a portion of the first patterned metal layer 164, and the second solder mask layer 190 exposes a portion of the second patterned metal layer 174. So far, the fabrication of the package structure 100 is substantially completed.

As indicated in FIG. 1G, the package structure 100 includes the substrate 110, the electronic device 120, the adhesive layer 130, the patterned metal layer 140, the heat-dissipating column 150, the first laminated structure 160, the second laminated structure 170, the first solder mask layer 180, and the second solder mask layer 190. The substrate 110 has the upper surface 111, the lower surface 113 opposite to the upper surface 111, and the opening 116 that communicates the upper surface 111 and the lower surface 113. Here, the substrate 110 is constituted by the insulating layer 112 and the patterned copper foil layer 114, for instance. The electronic device 120 is configured in the opening 116 of the substrate 110 and has the top surface 122 and the bottom surface 124. The top surface 122 and the bottom surface 124 of the electronic device 120 are opposite to each other. Here, the electronic device 120 includes an RF device, an active device, a passive device, a memory, or an electronic connector. The adhesive layer 130 is configured on the lower surface 113 of the substrate 110 and exposes a portion of the bottom surface 124 of the electronic device 120. The patterned metal layer 140 is adhered to the lower surface 113 of the substrate 110 through the adhesive layer 130 and exposes the portion of the bottom surface 124 of the electronic device 120. The heat-dissipating column 150 is configured on the portion of the bottom surface 124 of the electronic device 120 exposed by the adhesive layer 130 and the patterned metal layer 140. That is to say, the heat-dissipating column 150 is configured in the blind hole H that penetrates the adhesive layer 130 and the patterned metal layer 140. Here, the heat-dissipating column 150 connects the patterned metal layer 140 and the bottom surface 124 of the electronic device 120.

The first laminated structure 160 is configured on the upper surface 111 of the substrate 110 and covers the upper surface 111 of the substrate 110 and the top surface 122 of the electronic device 120. Here, the first laminated structure 160 is constituted by the first dielectric layer 162, the first patterned metal layer 164a, and the conductive vias 166 that penetrate the first dielectric layer 162. The first dielectric layer 162 and the first patterned metal layer 164 are sequentially stacked on the upper surface 111 of the substrate 110. The opening 116 is filled with the first dielectric layer 162. The first patterned metal layer 164 is electrically connected to the electronic device 120 through the conductive vias 166. The second laminated structure 170 is configured on the patterned metal layer 140 and covers the heat-dissipating column 150 and the patterned metal layer 140. Here, the second laminated structure 170 is constituted by the second dielectric layer 172 and the second patterned metal layers 174 and 176. The second dielectric layer 172 and the second patterned metal layers 174 and 176 are stacked on the patterned metal layer 140 and the heat-dissipating column 150, and the heat-dissipating column 150 is in physical contact with the second patterned metal layer 176. The first solder mask layer 180 is configured on the first laminated structure 160 and exposes a portion of the first patterned metal layer 164. The second solder mask layer 190 is configured on the second laminated structure 170 and exposes a portion of the second patterned metal layer 174.

The electronic device 120 described in this embodiment is embedded in the substrate 110, the first laminated structure 160, and the second laminated structure 170, and the bottom surface 124 of the electronic device 120 is in physical contact with the heat-dissipating column 150. Therefore, the heat generated by the electronic device 120 can be dissipated by the underlying heat-dissipating column 150, the second patterned metal layer 176, and the second patterned metal layer 174. As such, the package structure 100 of this embodiment can achieve favorable heat-dissipating effects. Besides, since the electronic device 120 is embedded in the substrate 110, the first laminated structure 160, and the second laminated structure 170, the package structure 100 can have small package volume and thin thickness. Further, the diameter of the opening 116 of the substrate 110 is greater than the diameter of the electronic device 120. Hence, when the electronic device 120 is configured in the opening 116 of the substrate 110, the favorable process window can be provided.

Figure 1H:
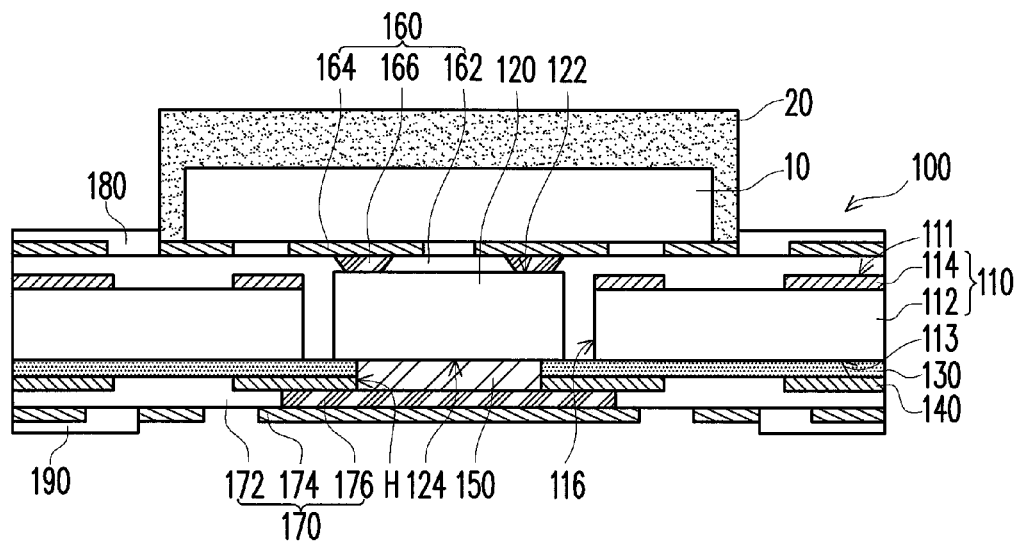
FIG. 1H is a schematic cross-sectional view illustrating that the package structure depicted in FIG. 1G carries a chip.

FIG. 1H is a schematic cross-sectional view illustrating that the package structure depicted in FIG. 1G carries a chip. With reference to FIG. 1H, the first patterned metal layer 164 and the second patterned metal layer 174 are configured on the outer surface of the package structure 100 in this embodiment. Accordingly, the package structure 100 can be electrically connected to a chip 10 through the first patterned metal layer 164, and the second patterned metal layer 174 can be electrically connected to an external circuit (not shown). Thereby, the applicability of the package structure 100 can be improved. The chip 10 is a semiconductor integrated circuit chip or a light emitting diode (LED) chip, which should not be construed as a limitation to the invention.

In particular, the chip 10 can be electrically connected to the first patterned metal layer 164 of the package structure 100 by flip-chip bonding, or the chip 10 and a portion of the package structure 100 can be encapsulated by an encapsulant 20, so as to protect the electrical connection between the chip 10 and the package structure 100. Although the chip 10 in this embodiment is electrically connected to the first patterned metal layer 164 of the package structure 100 by flip-chip bonding, it should be mentioned that the way to bond the chip 10 and the package structure 100 and the type of the chip 10 are not limited in the invention. However, in other embodiments that are not shown in the drawings, the chip can be electrically connected to the first patterned metal layer of the package structure by wire bonding through a plurality of bonding wires. The way to bond the chip 10 and the package structure 100 and the type of the chip 10 are exemplary and should not be construed as limitations to the invention.

In light of the foregoing, the electronic device described in the embodiments of the invention is embedded in the substrate and the laminated structures, and the bottom surface of the electronic device is in physical contact with the heat-dissipating column. Hence, the heat generated by the electronic device in use can be dissipated by means of the underlying heat-dissipating column and the patterned metal layer, such that the package structure can accomplish favorable heat-dissipating effects. Moreover, since the electronic device is embedded in the substrate and the laminated structures, the package structure described in the embodiments of the invention can have small package volume and thin thickness.

Further, the package metal layer is configured on the outer surface of the package structure as described in the embodiments of the invention, and thus the package structure discussed herein can be electrically connected to an electronic device or an external circuit through the patterned metal layer, thus improving the applicability of the package structure. In addition, the diameter of the opening of the substrate is greater than the diameter of the electronic device. Hence, when the electronic device is configured in the opening of the substrate, the favorable process window can be provided.

It will be apparent to those skilled in the art that various modifications and variations can be made to the structure of the disclosed embodiments without departing from the scope or spirit of the invention. In view of the foregoing, it is intended that the disclosure cover modifications and variations of this specification provided they fall within the scope of the following claims and their equivalents.

What is claimed is:

1. A manufacturing method of a package structure, comprising:
   providing a substrate, the substrate having an upper surface, a lower surface, and an opening, the upper surface and the lower surface being opposite to each other, the opening communicating the upper surface and the lower surface;
   configuring an electronic device in the opening of the substrate;
   laminating an adhesive layer and a patterned metal layer located on the adhesive layer on the lower surface of the substrate, the adhesive layer and the patterned metal layer exposing a bottom surface of the electronic device;
   forming a heat-dissipating column on the bottom surface of the electronic device exposed by the adhesive layer and the patterned metal layer after laminating the adhesive layer and the patterned metal layer located on the adhesive layer on the lower surface of the substrate, the heat-dissipating column connecting the patterned metal layer and the bottom surface of the electronic device; and
   respectively laminating a first laminated structure and a second laminated structure on the upper surface of the substrate and the patterned metal layer after forming the heat-dissipating column, the first laminated structure covering the upper surface of the substrate and a top surface of the electronic device, the second laminated structure covering the heat-dissipating column and the patterned metal layer, wherein the first laminated structure comprises at least one first dielectric layer, at least one first patterned metal layer, and at least one conductive via penetrating the at least one first dielectric layer, the at least one first dielectric layer and the at least one first patterned metal layer are sequentially stacked on the upper surface of the substrate, the opening is filled with the at least one first dielectric layer, and the at least one first patterned metal layer is electrically connected to the electronic device through the at least one conductive via.

2. The manufacturing method of the package structure as recited in claim 1, wherein the electronic device comprises a radio frequency device, an active device, or a passive device.

3. The manufacturing method of the package structure as recited in claim 1, wherein the second laminated structure comprises at least one second dielectric layer and at least one second patterned metal layer, the at least one second dielectric layer and the at least one second patterned metal layer are stacked on the patterned metal layer and the heat-dissipating column, and the heat-dissipating column is in physical contact with the at least one second patterned metal layer.

4. The manufacturing method of the package structure as recited in claim 1, after laminating the first laminated structure and the second laminated structure on the upper surface of the substrate and the patterned metal layer, further comprising:
   forming a first solder mask layer on the first laminated structure; and
   forming a second solder mask layer on the second laminated structure.

5. The manufacturing method of the package structure as recited in claim 1, wherein a method of laminating the first laminated structure and the second laminated structure on the upper surface of the substrate and the patterned metal layer comprises thermal lamination.

6. The manufacturing method of the package structure as recited in claim 1, wherein a method of forming the heat-dissipating column on the bottom surface of the electronic device exposed by the adhesive layer and the patterned metal layer comprises plating.

* * * * *